United States Patent
Moizumi

(10) Patent No.: US 12,386,272 B2
(45) Date of Patent: Aug. 12, 2025

(54) EXPOSURE APPARATUS, CONTROL METHOD OF EXPOSURE APPARATUS, INFORMATION PROCESSING APPARATUS, INFORMATION PROCESSING METHOD, AND ARTICLE MANUFACTURING METHOD

(71) Applicant: CANON KABUSHIKI KAISHA, Tokyo (JP)

(72) Inventor: Jun Moizumi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 154 days.

(21) Appl. No.: 18/483,918

(22) Filed: Oct. 10, 2023

(65) Prior Publication Data

US 2024/0126182 A1 Apr. 18, 2024

(30) Foreign Application Priority Data

Oct. 13, 2022 (JP) .................................. 2022-165019

(51) Int. Cl.
*G03F 7/00* (2006.01)

(52) U.S. Cl.
CPC .... *G03F 7/70641* (2013.01); *G03F 7/706845* (2023.05)

(58) Field of Classification Search
CPC .......... G03F 7/70641; G03F 7/706845; G03F 7/70258; G03F 7/70891; G03F 7/705; G03F 7/20; G03F 7/70483; G03F 7/706; G03F 7/70504; G03B 27/52; H01L 21/0274
See application file for complete search history.

(56) References Cited

U.S. PATENT DOCUMENTS

| 7,102,731 B2* | 9/2006 | Hirukawa | G03F 7/706 355/53 |
| 9,482,967 B2* | 11/2016 | Van De Kerkhof | G03F 7/706 |
| 10,394,134 B2* | 8/2019 | Koizumi | G03F 7/70258 |

FOREIGN PATENT DOCUMENTS

| JP | H10289865 A | 10/1998 |
| JP | 2006157020 A | 6/2006 |

* cited by examiner

*Primary Examiner* — Hung V Nguyen
(74) *Attorney, Agent, or Firm* — Canon U.S.A., Inc. IP Division

(57) ABSTRACT

An apparatus includes a control unit configured to control an adjustment unit for adjusting imaging characteristics of an optical system. In a period spanning a plurality of lots, the control unit measures imaging characteristics of the optical system, and decides a prediction coefficient in a prediction formula to fit the prediction formula to measurement data obtained by the measurement in the period spanning the plurality of lots. The prediction formula is a polynomial function including a term representing a change in measurement value of the imaging characteristics caused by changing at least one of an illumination mode and an original between lots. The control unit decides the term of the polynomial function such that a fitting residual falls within an allowable range.

19 Claims, 9 Drawing Sheets

EXPOSURE APPARATUS, CONTROL METHOD OF EXPOSURE APPARATUS, INFORMATION PROCESSING APPARATUS, INFORMATION PROCESSING METHOD, AND ARTICLE MANUFACTURING METHOD

BACKGROUND

Technical Field

The aspect of the embodiments relates to an exposure apparatus, a control method of the exposure apparatus, an information processing apparatus, an information processing method, and an article manufacturing method.

Description of the Related Art

In recent years, the required overlay accuracy is increasing in the DRAM and NAND processes of a semiconductor process. For example, the fluctuation allowable value of the magnification caused by exposure heat in a lot can be 0.1 ppm or less. In order to achieve this, it is conceivable to perform closed correction in which calibration is performed within the lot, but throughput decreases. To the contrary, there is a technique in which the fluctuation of aberration such as magnification caused by exposure heat is predicted for each exposure condition, thereby performing open correction. Hereinafter, the aberration fluctuation caused by exposure heat will be referred to as the "exposure history".

There has been proposed a technique of using the prediction coefficients of the exposure histories under some basic illumination conditions to predict the exposure history for exposure under another illumination condition (Japanese Patent Laid-Open No. H10-289865). However, since the exposure history changes depending on the diffracted light by an original, substrate reflectance, and the like, highly accurate prediction is difficult. Further, there has also been proposed a technique of predicting the exposure histories for a plurality of exposure conditions by measuring the exposure history during an exposure process (Japanese Patent Laid-Open No. 2006-157020).

When the magnification of the projection optical system caused by exposure heat is measured through the original, the measurement result includes the drawing error of the original. Since the drawing error of the original differs for each original, each time the original is replaced, an offset corresponding to the drawing error is added to the measurement value of the magnification. If the magnification fluctuation caused by exposure heat for each lot is predicted using the magnification measurement values obtained during exposure of a plurality of lots using different originals, it is difficult to accurately obtain the prediction model parameter for each lot.

SUMMARY

One aspect provides an apparatus including an optical system configured to project a pattern of an original onto a substrate, an adjustment unit configured to adjust imaging characteristics of the optical system, and a control unit configured to predict, using a prediction formula, fluctuation of the imaging characteristics caused by the projection optical system absorbing exposure energy, and control the adjustment unit based on a result of the prediction, wherein the control unit is configured to measure, in a period spanning a plurality of lots, the imaging characteristics, after completion of setting of an exposure condition for a next lot, at a timing before exposure of a leading substrate in the lot and a timing before exposure of a subsequent predetermined substrate, and decide a prediction coefficient in the prediction formula to fit the prediction formula to measurement data obtained by the measurement in the period spanning the plurality of lots, the prediction formula is a polynomial function including a term representing a change in measurement value of the imaging characteristics caused by changing at least one of an illumination mode and an original between lots, and the control unit is configured to decide the term of the polynomial function such that a fitting residual falls within an allowable range.

Further features of the disclosure will become apparent from the following description of exemplary embodiments (with reference to the attached drawings).

DESCRIPTION OF THE EMBODIMENTS

Figure 1:
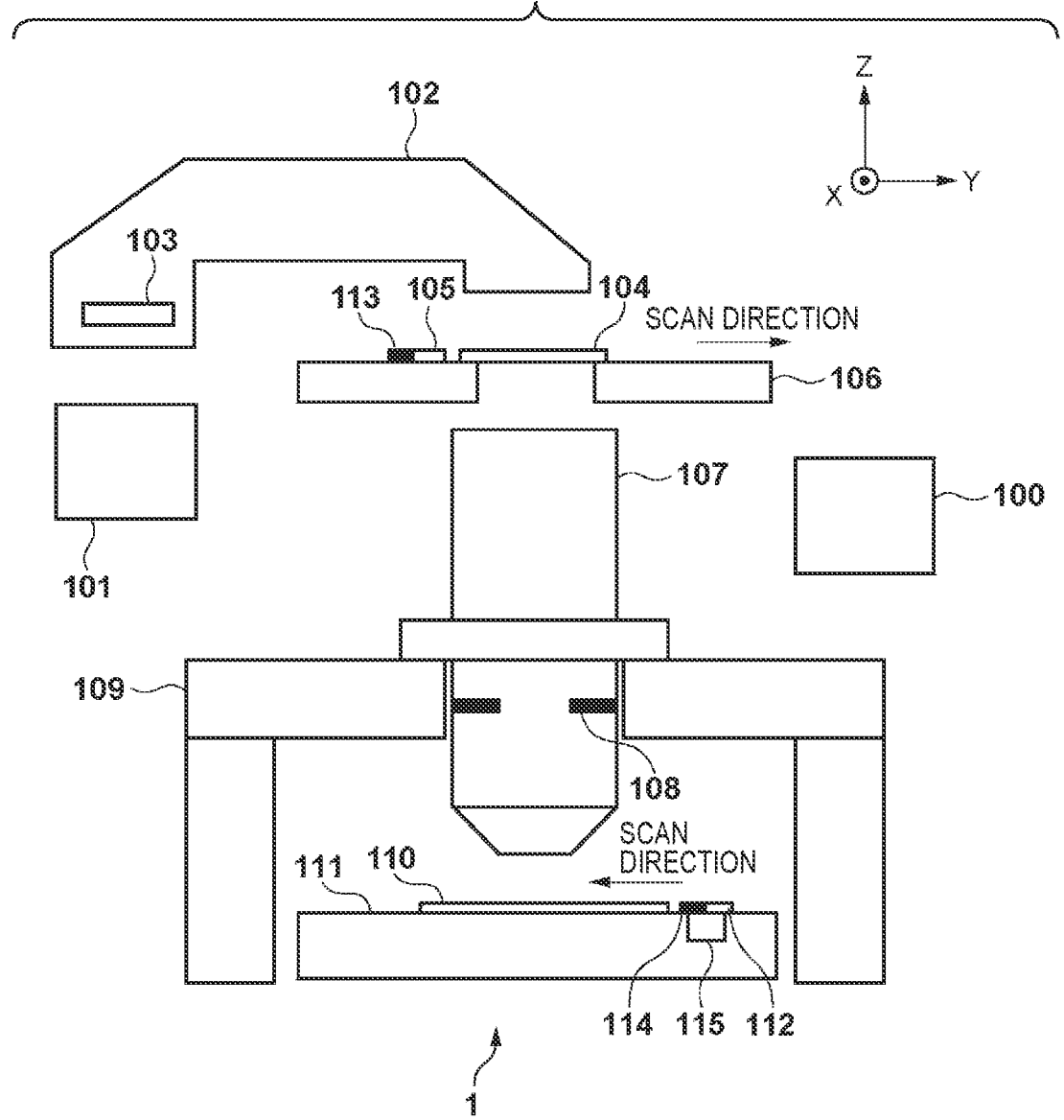
FIG. 1 is a view showing the arrangement of an exposure apparatus.

Hereinafter, embodiments will be described in detail with reference to the attached drawings. Note, the following embodiments are not intended to limit the scope of the disclosure. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 is a view showing the arrangement of an exposure apparatus 1 in an embodiment. In this specification and drawings, directions are indicated in an XYZ-coordinate system in which an X-Y plane is set as a horizontal plane. In general, a substrate 110 (wafer) is placed on a substrate stage 111 so that its surface will be parallel to the horizontal plane (X-Y plane). Hence, in the following description, directions perpendicular to each other in a plane along the surface of the substrate 110 are set as the X-axis and the Y-axis, and a direction perpendicular to the X-axis and the Y-axis is set as the Z-axis. Also, in the following description, directions parallel to the X-axis, the Y-axis, and the Z-axis will be set as the X direction, the Y direction, and the Z direction, respectively, in the XYZ-coordinate system.

Light emitted from a light source 101 enters an illumination optical system 102, forms a desired effective light source distribution by a diffraction optical element 103, and is applied onto an original 104 (mask or reticle). With this, the pattern drawn on the original 104 is reduction-projected onto the substrate 110 by a projection optical system 107, and thus exposure is performed. The original 104 is held by an original stage 106, and the original stage 106 can be scan-driven in the Y direction. When performing exposure, the substrate stage 111 holding the substrate 110 can be scan-driven in a direction opposite to the direction of scan-driving of the original stage 106. When exposure ends, the substrate stage 111 is step-driven to expose the next shot region.

A control unit 100 comprehensively controls respective units of the exposure apparatus. The control unit 100 can be formed from a computer apparatus (information processing apparatus) including a processor and a memory. For example, the control unit 100 can be formed from one of (a), (b), and (c) described below, or a combination of all or some of these components:
  (a) a Programmable Logic Device (PLD) such as a Field Programmable Gate Array (FPGA);
  (b) an Application Specific Integrated Circuit (ASIC); and
  (c) a general-purpose or dedicated computer incorporating a program.

In this embodiment, the diffraction optical element 103 is arranged on a plane that has a Fourier transform relationship with a plane conjugate to the original 104 serving as the surface to be illuminated (image plane) or the pupil plane of the illumination optical system 102. The diffraction optical element 103 forms, on a predetermined plane such as the pupil plane of the illumination optical system 102 which is a plane conjugate to the pupil plane of the projection optical system 107 or a plane conjugate to the pupil plane of the illumination optical system 102, a desired light intensity distribution by converting the light intensity distribution of the light flux from the light source 101 by a diffraction effect. As the diffraction optical element 103, a Computer Generated Hologram (CGH) that has been designed by a computer so that a desired diffraction pattern can be obtained on a diffraction pattern plane may be used. The light source shape formed on the pupil plane of the projection optical system 107 will be referred to as an "effective light source shape". Note that in this specification, an "effective light source" means the light intensity distribution or the light angle distribution on a surface to be illuminated and a conjugate plane thereof. In an example, the diffraction optical element 103 can be a diffraction optical element selected from a plurality of diffraction optical elements that convert the light flux from the light source 101 into different light intensity distributions. Each of the plurality of diffraction optical elements is mounted while being attached to a corresponding one of a plurality of slots of a turret (not shown). The plurality of diffraction optical elements can form different effective light source shapes. The plurality of diffraction optical elements can include a diffraction optical element for modified illumination during exposure. Based on the effective light source shapes of modified illumination, the illumination modes are referred to as small σ illumination, large σ illumination, annular illumination, dipole illumination, quadrupole illumination, and the like.

The original stage 106 includes an original reference plate 105 different from the original 104, and an original-side mark 113 for aerial image measurement is arranged on the original reference plate 105. The original-side mark 113 can be a pattern including periodically arranged lines and spaces. Further, a substrate reference plate 112 is arranged on the substrate stage 111. A substrate-side mark 114 for aerial image measurement is arranged on the substrate reference plate 112. The substrate-side mark 114 can be a pattern including lines and spaces arranged at the same pitch as the line-and-space pattern of the original-side mark 113. Furthermore, a light detector 115 is arranged below the substrate reference plate 112.

The lines of the line-and-space pattern in each of the original-side mark 113 and the substrate-side mark 114 can be made of chrome, and the spaces thereof can be made of glass. The original stage 103 is scan-driven in the Y direction and stopped so that the light emitted from the light source 101 is applied to the original-side mark 113 on the original reference plate 105 via the illumination optical system 102. The light having passed through the original-side mark 113 of the original reference plate 105 reaches the substrate-side mark 114 on the substrate reference plate 112 via the projection optical system 107. The light having reached the substrate-side mark 114 passes through the substrate-side mark 114 on the substrate reference plate 112, and reaches the light detector 115.

Next, aerial image measurement as the measurement method of measuring an image shift will be described. The light emitted from the light source 101 is applied to the original-side mark 113 via the illumination optical system 102, and the image of the original-side mark 113 is reduction-projected onto the substrate-side mark 114 by the projection optical system 107. When the substrate stage 111 is scan-driven in the X direction perpendicular to the optical axis direction while the image is reduction-projected, the reduction-projected image of the original-side mark 113 overlaps the substrate-side mark 114 at the imaging position of the projection optical system 107, and the light amount received by the light detector 115 becomes maximum. To the contrary, when the substrate-side mark 114 is shifted from the imaging position of the projection optical system 107, the overlap between the reduction-projected image of the original-side mark 113 and the substrate-side mark 114 decreases, so that the light amount received by the light detector 115 gradually decreases.

Figure 2:
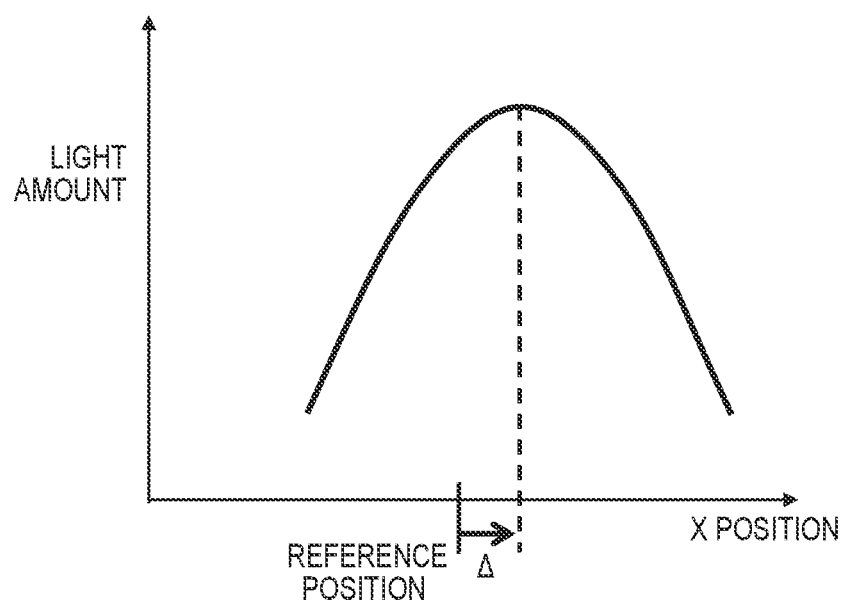
FIG. 2 is a graph showing the relationship between the shift and the light amount during aerial image measurement.

FIG. 2 shows an example of the change in light amount in a case in which, while the image of the original-side mark 113 is reduction-projected onto the substrate-side mark 112, the substrate stage 111 is scan-driven in the X direction across the imaging position of the projection optical system 107. In FIG. 2, the abscissa represents the X-direction position of the substrate stage 111, and the ordinate represents the light amount received by the light detector 115. The light amount received by the light detector 115 with respect to the X-direction position of the substrate stage 111 draws an upward convex curve. The peak position of the curve is set as the imaging position of the projection optical system 107, and the difference from the reference position is set as the image shift (A). Note that the method of obtaining the image shift is not limited to this. The image shift may be obtained by another method.

A plurality of (for example, two) original-side marks 113 are arranged at different positions in the X direction, and the above-described image shift measurement is performed for each original-side mark. From the respective image shift measurement results and a plurality of X-direction spans converted into the image side, the magnification can be obtained. In this specification, this will be referred to as "magnification measurement" as one of imaging characteristic measurement operations.

Next, prediction of the fluctuation of the imaging characteristics of the projection optical system 107 caused by exposure heat (to be referred to as the "exposure history" hereinafter) will be described.

Consider a case in which exposure light is applied to the mark on the original 104, thereby forming the image of the mark on the substrate stage 111 via the projection optical system 107. When exposure light is applied to the projection optical system 107, the exposure energy is absorbed by the glass material itself of the lens forming the projection optical system 107 or an anti-reflection film on the surface of the lens. This rises the temperature of the lens, and the refractive index of the lens changes. If the refractive index of the lens forming the projection optical system 107 changes, the imaging characteristics change. Here, the imaging characteristics include wave aberration, focus, magnification, distortion, field curvature, astigmatism, and the like, but in this specification, magnification will be used to describe the exposure history prediction model. The magnification of the projection optical system 107 caused by exposure heat will be referred to as the "exposure magnification".

The exposure apparatus 1 includes an adjustment unit 120 that adjusts the imaging characteristics. In an example, the adjustment unit 120 can adjust at least one of the position, posture, shape, and temperature of a part of the optical element (for example, lens) forming the projection optical system 107. The adjustment unit 120 includes, for example, a mechanism that drives the lens in the optical axis direction (Z direction) and a direction perpendicular to the optical axis direction, a mechanism that drives a support unit supporting the optical element, a mechanism that applies a stress (a force pressing or pulling the optical element) to the optical element, a mechanism that heats or cools the optical element, and the like. The driving operations as described above in the adjustment unit 120 are controlled by the control unit 100. Note that, in one embodiment, the adjustment unit is required to adjust the imaging characteristics by performing at least one of driving of the optical element of the projection optical system 107, driving of the original stage 106, and driving of the substrate stage 111. The control unit 100 can correct the magnification by predicting the magnification fluctuation and controlling the adjustment unit 120 so as to cancel the predicted magnification fluctuation.

The control unit 100 measures the imaging characteristics (magnification measurement), after completion of setting of an exposure condition for the next lot (including the leading lot) in a period spanning a plurality of lots, at the timing before exposure of the leading substrate in the lot and the timing before exposure of a subsequent predetermined substrate. A specific example will be described below.

In the following description, a "job" refers to a series of operations for exposing substrates of one lot (a predetermined number of substrates (for example, 25 substrates)) in accordance with an exposure recipe (to be referred to as a "recipe" hereinafter) including an exposure load and a prediction model parameter. The recipe includes instruction contents of the actual process defined by the user, and the original, illumination condition, exposure amount, shot size, the number of shots, resist reflectance, and the like can differ for each exposure condition. A plurality of exposure conditions can be implemented by, for example, using different originals between lots. Alternatively, a plurality of exposure conditions can be implemented by, for example, using different illumination modes between lots. Alternatively, a plurality of exposure conditions can be implemented by, for example, using different combinations of the original and the illumination mode between lots.

When the first job is started, the control unit 100 executes magnification measurement before exposure of the leading substrate in the lot is started, thereby acquiring the magnification before exposure. This is referred to as the "lot leading magnification". The lot leading magnification includes the static magnification of the projection optical system 107 and the arrangement error of the original-side mark 113 (to be referred to as the "original drawing error" hereinafter).

After exposure in the first job is started, the control unit 100 executes magnification measurement before exposure of the predetermined substrate, thereby acquiring the fluctuation of the exposure magnification in the lot. This is referred to as the "intra-lot magnification". The intra-lot magnification includes the static magnification of the projection optical system 107, the original drawing error, and the exposure magnification that fluctuates due to exposure. Note that "for each predetermined substrate" may be "for each substrate" or "every N substrates" (N is a predetermined natural number).

After the first job, when the second job using an original different from the original used in the first job is started, the control unit 100 executes magnification measurement as in the first job, thereby acquiring the lot leading magnification and the intra-lot magnification. The lot leading magnification at this time includes the static magnification of the projection optical system 107, the original drawing error different from the first job, and the influence of the exposure magnification of the first job. The intra-lot magnification includes the static magnification of the projection optical system 107, the original drawing error different from the first job, and the exposure magnification of the second job. The jobs having a plurality of exposure conditions as described above are repeated while executing magnification measurement.

The control unit 100 (processing unit) performs a process of deciding a prediction coefficient in a prediction formula (model formula) to fit the prediction formula to the measurement data obtained by the above-described magnification measurement in the period spanning the plurality of lots. A specific example will be described below.

The control unit 100 uses following model formulas (1), (2), and (3) with respect to the acquired magnification fluctuation, thereby deciding a prediction model parameter for each exposure condition. The prediction model parameter is a prediction coefficient that expresses the saturation amount of the exposure magnification at a unit exposure load at each time constant. $\varphi$ is the predicted amount of the modeled exposure magnification, and a suffix N indicates the timing of the measured magnification. In this specification, prediction model parameters P of three time constant K models are used. Accordingly, a suffix m indicates the model number. $\alpha$ indicates the exposure load, which changes in accordance with the exposure condition. The exposure load $\alpha$ is represented by an original transmittance R, an exposure amount D, a shot size A, the number of shots Num between two magnification measurement operations, and a time T between the two magnification measurement operations. A suffix c means that the parameter changes for each exposure condition. Another parameter such as the resist reflectance may be used in the calculation of the exposure load.

$$\varphi_N = \varphi_{1N} + \varphi_{2N} + \varphi_{3N} \tag{1}$$

$$\varphi_{mN} = P_{cm}*\varphi_{1N\alpha cN} - (P_{cm}*\alpha_{cN} - \varphi_{mN-1})*\exp(-T_N/K_m) \tag{2}$$

$$\alpha_{cN} = (R_c*D_c*A_c*Num_{cN})/T_N \tag{3}$$

Figure 3:
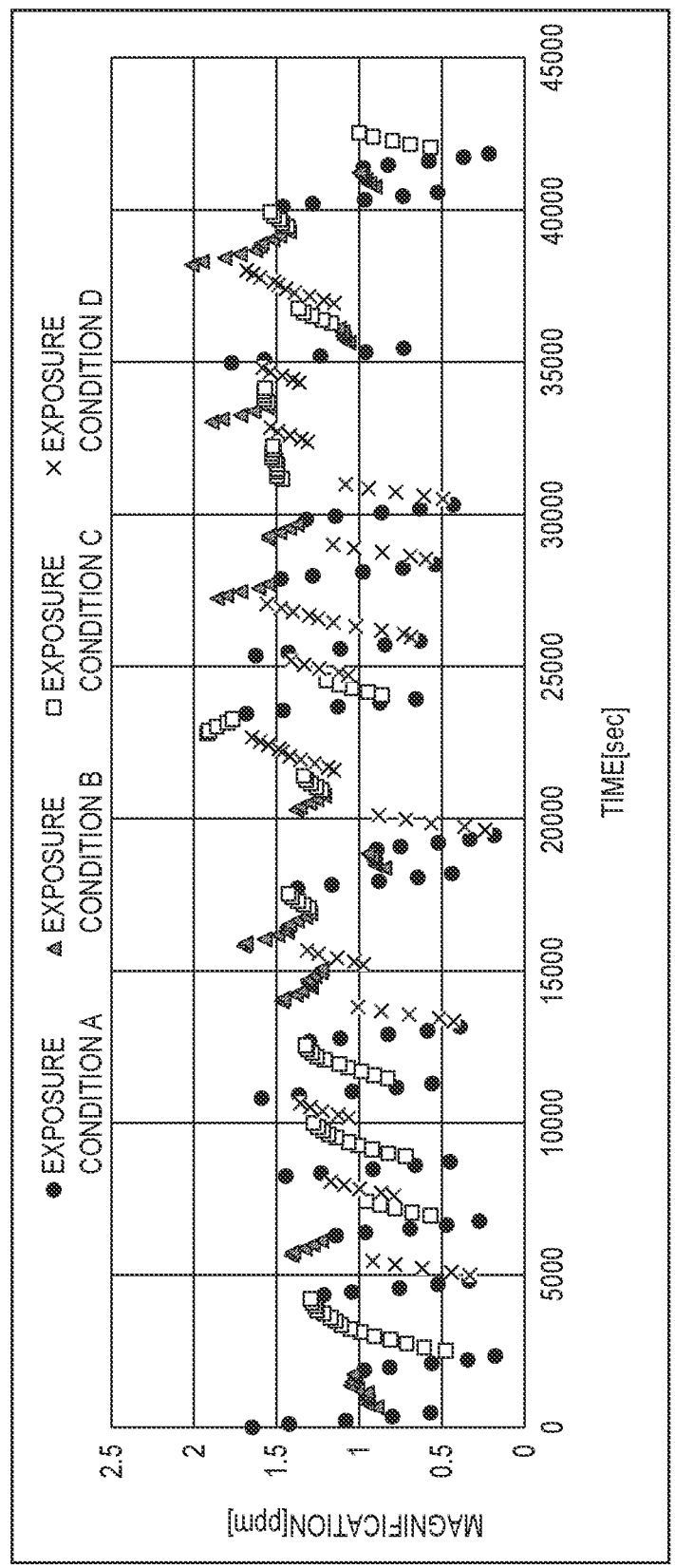
FIG. 3 is a graph showing an example of the magnification fluctuation.

FIG. 3 shows magnification fluctuation G obtained when jobs with four exposure conditions are randomly executed and the lot leading magnification and the intra-lot magnification are measured. The control unit 100 performs fitting of the model formula to the measurement data. For example, fitting is performed by using, as a variable, the prediction model parameter for each exposure condition in model formula (1) described above, and deciding the prediction model parameter using the least squares method such that a difference F (equation (4)) between the prediction of the prediction model and the actual magnification fluctuation becomes small.

$$F = \Sigma_N (\varphi_N - G_N)^2 \quad (4)$$

Figure 4A:
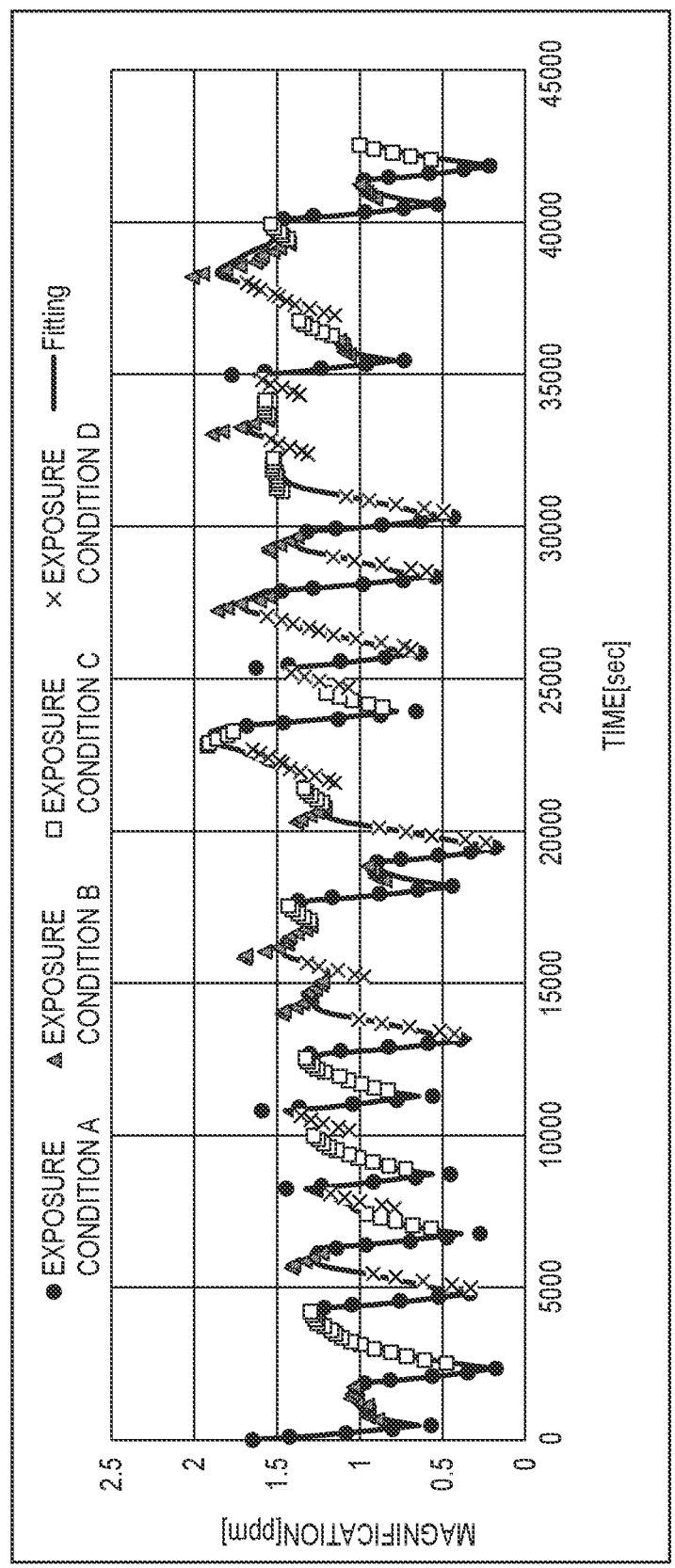
FIGS. 4A and 4B are graphs showing fitting results of a conventional prediction model.
Figure 4B:
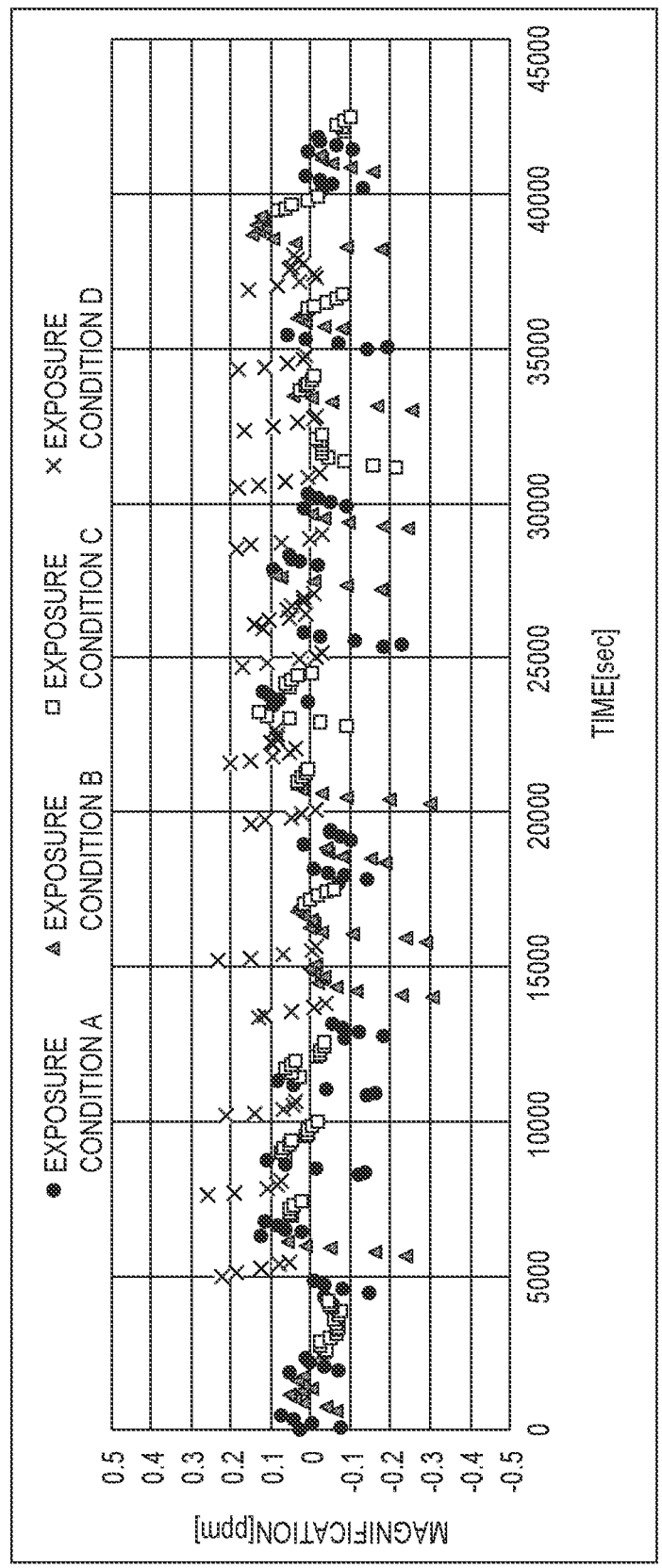

Note that a method other than the least squares method may be used for fitting. FIG. 4A shows the result of fitting to the actual magnification fluctuation, and FIG. 4B shows the fitting residual. Referring to FIG. 4B, it can be seen that fitting is not done in portion where an exposure condition D is switched to an exposure condition B. As shown in FIG. 4B, the maximum fitting residual is 0.3 ppm or more. This is because the magnification fluctuation occurs due to the original drawing error irrelevant to exposure heat. In this manner, when mixingly executing jobs in which the difference in original drawing error upon job switching largely differs for each exposure condition, if the prediction model parameters for a plurality of exposure conditions are obtained using the conventional prediction model, the prediction error in fluctuation of the exposure magnification becomes large.

Therefore, a prediction model, which includes the original drawing error, to be added to the above-described prediction model is needed. It is also possible to decide the prediction model parameter from the conventional prediction model by using the original drawing error measured by the manufacturer of the original and removing the amount corresponding to the original drawing error from the acquired magnification fluctuation. However, since the original drawing error changes due to distortion upon mounting the original 104 on the original stage 106, in order to more strictly control the overlay accuracy, it is more accurate to use the measurement value of the magnification in a state in which the original 104 is actually mounted on the original stage 106. In addition, distortion upon mounting the original on the original stage is not always the same. Hence, even if the prediction model parameter is decided using the conventional prediction model by removing, from the acquired magnification fluctuation, the magnification measurement value obtained when the original is mounted on the original stage 106 while no exposure magnification has occurred in the projection optical system 107, a prediction error is generated.

Model formula (5) (prediction formula) obtained by adding a term of an original drawing error E to formula (1) is described below. The original drawing error is a variable which differs for each exposure condition. Model formula (5) is a polynomial function including the term (original drawing error E) representing a change in measurement value of the imaging characteristics caused by changing at least one of the illumination mode and the original between lots.

$$\varphi'_N = \varphi_{1N} + \varphi_{2N} + \varphi_{3N} + E_C \quad (5)$$

$$F' = \Sigma_N (\varphi'_N - G_N)^2 \quad (6)$$

The control unit 100 decides the term (original drawing error E) of the polynomial function (model formula (5)) such that the fitting residual falls within an allowable range. For example, the control unit 100 decides the prediction model parameter P and the original drawing error E by the least squares method such that F' of equation (6) including model formula (5) becomes small with respect to the magnification fluctuation (G).

Figure 5A:
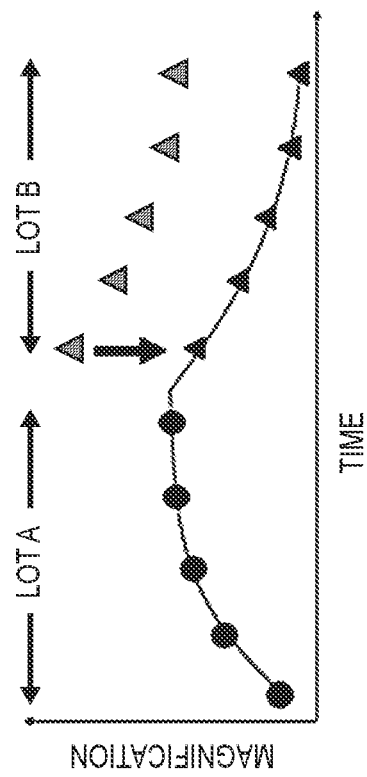
FIGS. 5A and 5B are graphs showing the concept of fitting using a prediction model in an embodiment.
Figure 5B:
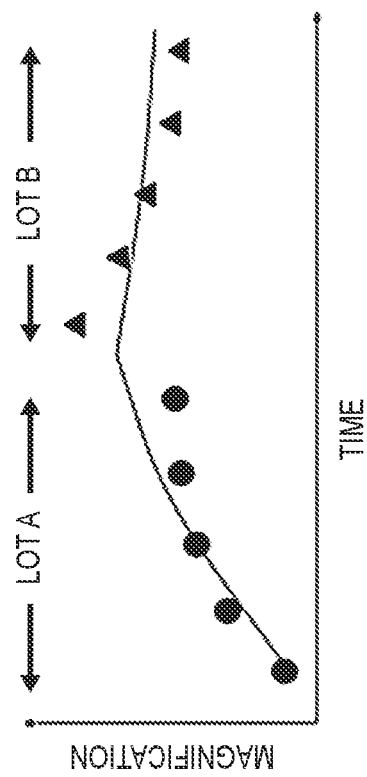

With reference to FIGS. 5A and 5B, a method of deciding the prediction model parameter P and the original drawing error E, which are variables for fitting of model formula (5), will be described.

In FIG. 5A, the plot indicated by a black circle represents the generation amount of magnification in a lot A. In the lot A, the magnification of the projection optical system increases due to exposure. The plot indicated by a black triangle represents the generation amount of magnification in a lot B executed after the lot A. In the lot B, the magnification of the projection optical system decreases due to exposure.

When switching from the lot A to the lot B, a change occurs due to a factor other than the influence of exposure. For example, when switching from the lot A to the lot B, the magnification can jump (change largely) between the lot A and the lot B due to the original drawing error E. If this change is expressed using the conventional exposure history prediction model, a deviation is generated between the generation amount of magnification (each plot) and the prediction (solid line). Since the conventional exposure history prediction model uses recurrence formulas, it can represent a state that is continuous from the immediately preceding state. Therefore, in a state in which the value jumps, the accurate prediction cannot be obtained. As a result, the exposure history in the lot cannot be accurately predicted in the lot A and the lot B.

FIG. 5B shows a state in which prediction is performed between the lots while including a change model (original drawing error E here) different from the influence of exposure in this embodiment. The term of the original drawing error E has a role of correcting the amount corresponding to the jump in the lot B, thereby enabling fitting while extracting the influence of exposure in the lot in the lot A and the lot B. In the example shown in FIG. 5B, correction is performed by generally making the generation amount of magnification (gray triangles) negative (black triangles) in the lot B. With this, it is possible to obtain the prediction model parameter P and the original drawing error E so as to make the prediction (solid line) overlap the generation amounts of the magnification (black circles and black triangles) in the lot A and the lot B.

Figure 6A:
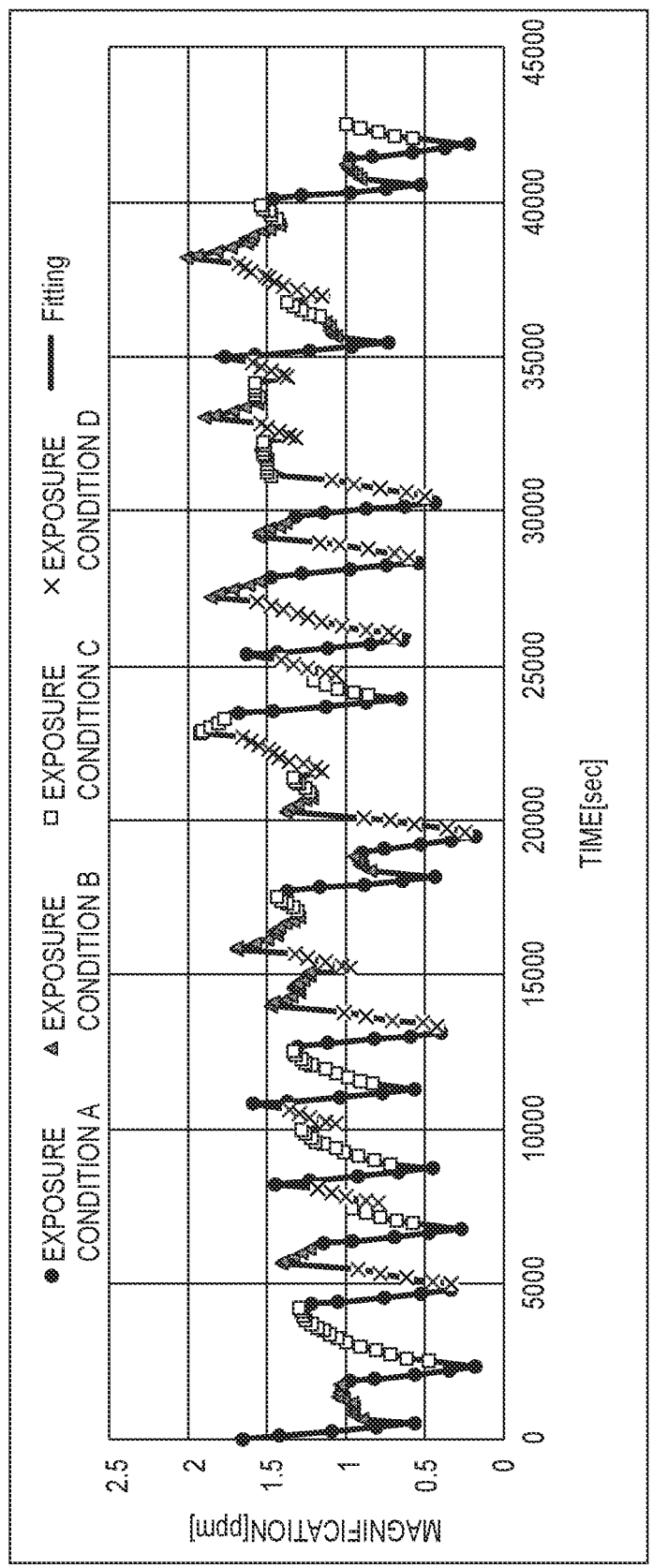
FIGS. 6A and 6B are graphs showing fitting results of the prediction model in the embodiment.
Figure 6B:
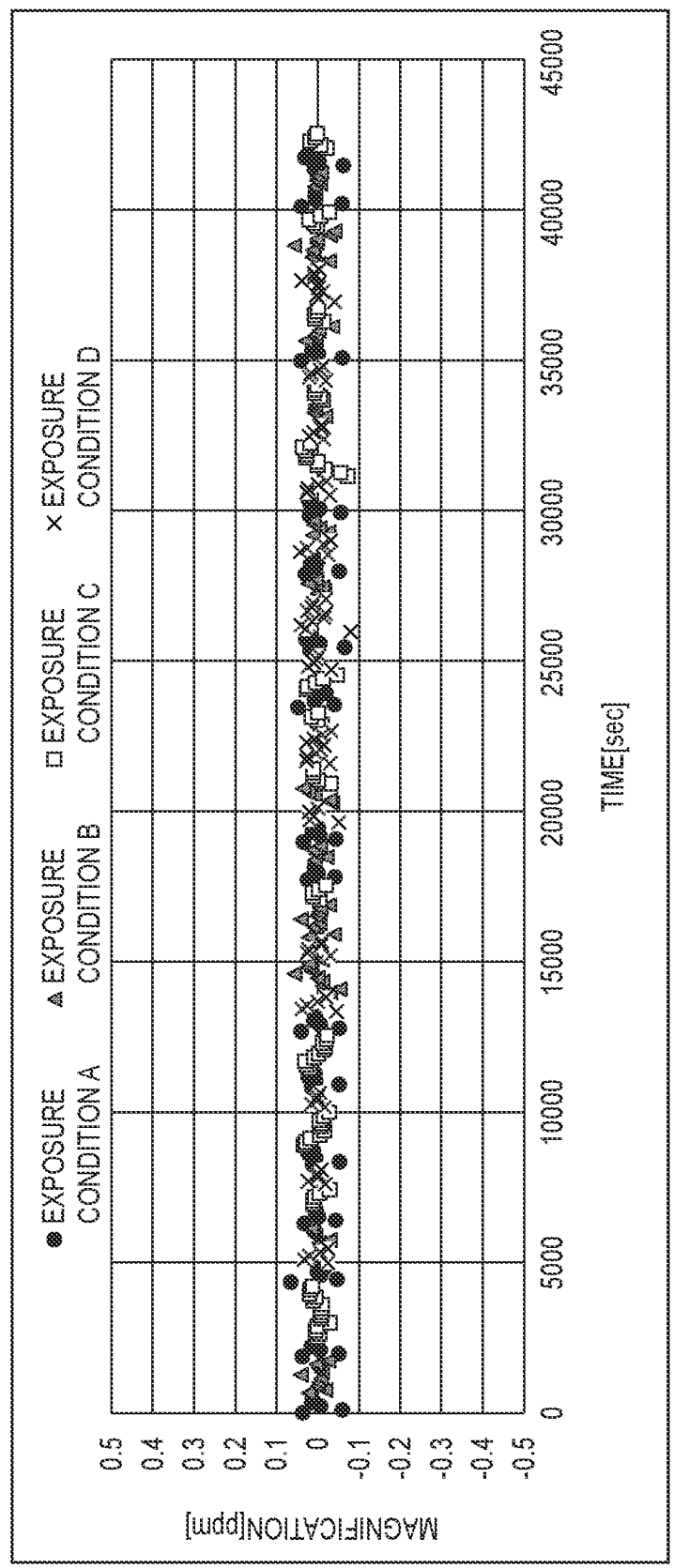

FIG. 6A shows the fitting result in this case, and FIG. 6B shows the fitting residual. Referring to FIG. 6A, it can be seen that excellent fitting is achieved even in portions (for example, around 20,000 sec) where the exposure condition D is switched to the exposure condition B as shown in the conventional prediction model. In FIG. 6B, the fitting residual is 0.1 ppm or less, and this is a better result than in the conventional model. Therefore, according to this embodiment, for the magnification fluctuation including a fluctuation factor other than exposure heat, it is possible to decide the prediction model parameter suppressing the prediction error.

In this embodiment, only the original drawing error has been described, but there is another magnification fluctuation which changes due to a factor other than exposure heat. For example, the measurement value of magnification obtained by aerial image measurement via the projection optical system 107 including the static coma aberration tilt differ for each illumination condition used in measurement. The above-described embodiment can also be applied to this case while rewording the parameter of the original drawing error of the model in this embodiment with the magnification fluctuation caused by coma aberration of the projection optical system 107. Further, the above-described embodiment can also be applied to a case in which the original drawing error and the magnification fluctuation caused by coma aberration of the projection optical system 107 are mixed.

In the above-described embodiment, it has been described that the magnification fluctuation is obtained using the measurement value of the magnification. In an example, the control unit 100 is configured to predict the fluctuation of the imaging characteristics (for example, magnification fluctuation) by a prediction model, and perform correction by driving the lens of the projection optical system 107 by the adjustment unit 120 so as to cancel the predicted fluctuation of the imaging characteristics. In this case, the generation amount of magnification may be obtained using the correction amount and the measurement value of magnification to obtain the magnification fluctuation.

In the above-described embodiment, the magnification caused by exposure heat has been described as an example of the imaging characteristics. However, the above-described embodiment can also be applied to other aberrations such as focus, distortion, field curvature, and astigmatism.

Figure 7:
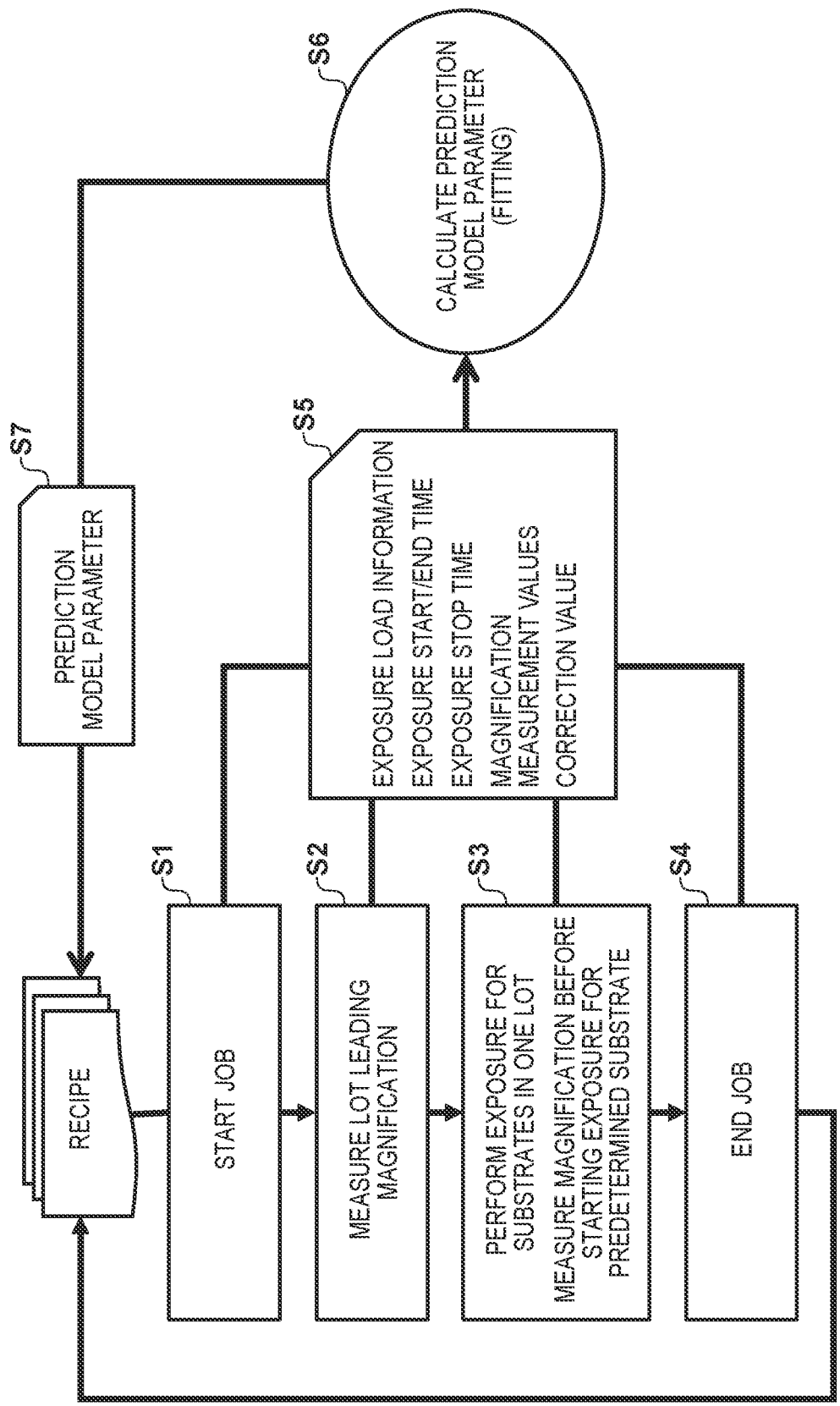
FIG. 7 is a flowchart illustrating a method of calculating and reflecting a prediction model parameter in the embodiment.

With reference to the flowchart of FIG. 7, a method (information processing method) of calculating and reflecting the prediction model parameter will be described.

In step S1, a job with a given recipe is started. In step S2, the control unit 100 measures the lot leading magnification. In step S3, the control unit 100 performs exposure for the respective substrates in the lot. At this time, for example, the control unit 100 predicts the fluctuation of the imaging characteristics (magnification fluctuation) using a prediction formula (model formula), controls the adjustment unit 120 based on the result of the prediction, and performs exposure for the substrates. Further, the control unit 100 performs magnification measurement before starting exposure for a predetermined substrate in the lot. The predetermined substrate includes, for example, the fourth, seventh, thirteenth, and twenty-fifth substrates of 25 substrates per lot. In step S4, the job ends. Subsequently, steps S1 to S4 are repeated for a job following another recipe.

Each time the job ends in step S4, step S5 is performed to calculate the prediction model parameter. In step S5, the control unit 100 stores the magnification measurement values obtained in steps S2 and S3, and the correction value in a memory. Further, the control unit 100 also stores, in the memory, the exposure load information, exposure start time ($T_s$) and the exposure stop time ($T_e$) obtained from the recipe. Here, the exposure load information can include the shot size $A_c$, the exposure amount $D_c$, the original transmittance $R_c$, the number of shots $Num_c$ between two magnification measurement operations, and the time T between the two magnification measurement operations.

In step S6, the control unit 100 serving as the prediction model parameter calculation system calculates new prediction model parameter $P_c$ and the original drawing error $E_c$ for each recipe. More specifically, the control unit 100 calculates the magnification fluctuation G based on the magnification measurement values and correction value stored in the memory. Then, the control unit 100 performs fitting of the calculated magnification fluctuation G by the least squares method while using prediction model formula (5), which uses the prediction model parameter $P_{cm}$ and the original drawing error $E_c$ for each recipe as variables, such that F' of equation (6) becomes small. With this, the new prediction model parameter $P_c$ and the original drawing error $E_c$ for each recipe are calculated.

In step S7, the control unit 100 reflects the calculated prediction model parameter $P_{cm}$ for each recipe. Subsequently, when a job with the recipe reflecting the new prediction model parameter $P_{cm}$ is started, prediction and correction are performed using the new prediction model parameter $P_{cm}$.

Note that step S6 of obtaining the prediction model parameter and step S7 can be performed after measurement data for multiple lots are accumulated in step S5. Alternately, steps S6 and S7 may be performed not after measurement data for multiple lots are accumulated but each time measurement is performed, thereby updating the prediction coefficient.

<Embodiment of Article Manufacturing Method>

An article manufacturing method according to an embodiment of the disclosure suitably manufactures an article, for example, a microdevice such as a semiconductor device or an element having a microstructure. The article manufacturing method of this embodiment includes a step of forming a latent pattern by using the above-described exposure apparatus on a photosensitive agent applied on a substrate (a step of exposing the substrate), and a step of developing the substrate on which the latent pattern has been formed in the above step. In addition, the manufacturing method includes other well-known steps (oxidation, film formation, deposition, doping, planarization, etching, resist removal, dicing, bonding, packaging, and the like). The article manufacturing method of this embodiment is more advantageous than the conventional methods in at least one of the performance, quality, productivity, and production cost of the article.

Other Embodiments

Embodiment(s) of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-165019, filed Oct. 13, 2022, which is hereby incorporated by reference herein in its entirety.

What is claimed is:

1. An apparatus comprising:
an optical system configured to project a pattern of an original onto a substrate;
an adjustment unit configured to adjust imaging characteristics of the projection optical system; and
a control unit configured to predict, using a prediction formula, fluctuation of the imaging characteristics caused by the optical system absorbing exposure energy, and control the adjustment unit based on a result of the prediction,
wherein
the control unit is configured to
measure, in a period spanning a plurality of lots, the imaging characteristics, after completion of setting of an exposure condition for a next lot, at a timing before exposure of a leading substrate in the lot and a timing before exposure of a subsequent predetermined substrate, and
decide a prediction coefficient in the prediction formula to fit the prediction formula to measurement data obtained by the measurement in the period spanning the plurality of lots,
the prediction formula is a polynomial function including a term representing a change in measurement value of the imaging characteristics caused by changing at least one of an illumination mode and an original between lots, and
the control unit is configured to decide the term of the polynomial function such that a fitting residual falls within an allowable range.

2. The apparatus according to claim 1, wherein the control unit decides the prediction coefficient in the prediction formula each time the measurement is performed.

3. The apparatus according to claim 1, wherein the imaging characteristics include at least one of magnification, focus, distortion, field curvature, and astigmatism.

4. The apparatus according to claim 1, wherein the control unit controls the adjustment unit so as to cancel the predicted fluctuation of the imaging characteristics.

5. The apparatus according to claim 1, wherein the measurement is aerial image measurement.

6. A control method of an apparatus that performs a process of exposing a substrate via an optical system while predicting, using a prediction formula, fluctuation of imaging characteristics of the optical system caused by the optical system absorbing exposure energy, and adjusting the imaging characteristics of the optical system based a result of the prediction, the method comprising:
measuring, in a period spanning a plurality of lots, the imaging characteristics, after completion of setting of an exposure condition for a next lot, at a timing before exposure of a leading substrate in the lot and a timing before exposure of a subsequent predetermined substrate, and
deciding a prediction coefficient in the prediction formula to fit the prediction formula to measurement data obtained by the measurement in the period spanning the plurality of lots,
wherein
the prediction formula is a polynomial function including a term representing a change in measurement value of the imaging characteristics caused by changing at least one of an illumination mode and an original between lots, and
in the deciding, the term of the polynomial function is decided such that a fitting residual falls within an allowable range.

7. The method according to claim 6, wherein the deciding is performed each time the measuring is performed.

8. The method according to claim 6, wherein the characteristics include at least one of magnification, focus, distortion, field curvature, and astigmatism.

9. The method according to claim 6, wherein the characteristics are adjusted so as to cancel the predicted fluctuation of the characteristics.

10. The method according to claim 6, wherein the measurement is aerial image measurement.

11. An apparatus comprising
a processing unit configured to predict, using a prediction formula, fluctuation of characteristics caused by an optical system, which is configured to project a pattern of an original onto a substrate, absorbing exposure energy,
wherein
the processing unit is configured to
measure, in a period spanning a plurality of lots, the imaging characteristics, after completion of setting of an exposure condition for a next lot, at a timing before exposure of a leading substrate in the lot and a timing before exposure of a subsequent predetermined substrate, and
decide a prediction coefficient in the prediction formula to fit the prediction formula to measurement data obtained by the measurement in the period spanning the plurality of lots,
the prediction formula is a polynomial function including a term representing a change in measurement value of the imaging characteristics caused by changing at least one of an illumination mode and an original between lots, and
the processing unit decides the term of the polynomial function such that a fitting residual falls within an allowable range.

12. The apparatus according to claim 11, wherein the processing unit decides the prediction coefficient in the prediction formula each time the measurement is performed.

13. The apparatus according to claim 11, wherein the imaging characteristics include at least one of magnification, focus, distortion, field curvature, and astigmatism.

14. A method of predicting, using a prediction formula, fluctuation of imaging characteristics of an optical system caused by the optical system absorbing exposure energy, the method comprising:
acquiring, in a period spanning a plurality of lots, data concerning the imaging characteristics, after completion of setting of an exposure condition for a next lot, at a timing before exposure of a leading substrate in the lot and a timing before exposure of a subsequent predetermined substrate, and
deciding a prediction coefficient in the prediction formula to fit the prediction formula to the data concerning the imaging characteristics acquired in the acquiring in the period spanning the plurality of lots, wherein
the prediction formula is a polynomial function including a term representing a change in measurement value of the imaging characteristics caused by changing at least one of an illumination mode and an original between lots, and in the deciding, the term of the polynomial function is decided such that a fitting residual falls within an allowable range.

15. The method according to claim 14, wherein the predicting decides the prediction coefficient in the prediction formula each time the measurement is performed.

16. The method according to claim 14, wherein the imaging characteristics include at least one of magnification, focus, distortion, field curvature, and astigmatism.

17. A method comprising:
acquiring, in a period spanning a plurality of lots, data concerning characteristics of an optical system, which is caused by the optical system absorbing exposure energy, after completion of setting of an exposure condition for a next lot, at a timing before exposure of a leading substrate in the lot and a timing before exposure of a subsequent predetermined substrate;

deciding a prediction coefficient in a prediction formula to fit the prediction formula, which is used to predict fluctuation of the imaging characteristics, to the data concerning the imaging characteristics acquired in the acquiring in the period spanning the plurality of lots;

predicting the fluctuation of the imaging characteristics using the prediction formula;

exposing a substrate via the optical system while adjusting the imaging characteristics based on a prediction result in the predicting; and developing the substrate exposed in the exposing,
wherein an article is manufactured from the substrate developed in the developing.

18. The method according to claim 17, wherein the predicting decides the prediction coefficient in the prediction formula each time the measurement is performed.

19. The method according to claim 17, wherein the imaging characteristics include at least one of magnification, focus, distortion, field curvature, and astigmatism.

\* \* \* \* \*